(12) United States Patent
Han et al.

(10) Patent No.: US 6,823,815 B2
(45) Date of Patent: Nov. 30, 2004

(54) WAFER AREA PRESSURE CONTROL FOR PLASMA CONFINEMENT

(75) Inventors: Taejoon Han, Pleasanton, CA (US); David W. Benzing, San Jose, CA (US); Albert R. Ellingboe, Lucan (IE)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/225,655

(22) Filed: Aug. 21, 2002

(65) Prior Publication Data

US 2002/0190657 A1 Dec. 19, 2002

Related U.S. Application Data

(62) Division of application No. 09/684,695, filed on Oct. 4, 2000, now Pat. No. 6,492,774.

(51) Int. Cl.[7] .............................................. C23C 16/00
(52) U.S. Cl. .............................. 118/723 E; 315/111.21
(58) Field of Search ....................... 315/111.01, 111.91, 315/111.11, 111.21, 111.31, 111.71, 111.81; 118/723 R, 723 E, 718, 715; 438/710; 156/345.41, 345.47, 345.51, 345.54, 345.55, 345

(56) References Cited

U.S. PATENT DOCUMENTS

| 5,246,532 A | 9/1993 | Ishida .......................... 156/345 |
| 5,534,751 A | 7/1996 | Lenz et al. ............. 315/111.71 |
| 5,660,673 A | 8/1997 | Miyoshi ..................... 156/345 |
| 5,998,932 A * | 12/1999 | Lenz ...................... 315/111.21 |
| 6,008,130 A * | 12/1999 | Henderson et al. ......... 156/345 |
| 6,019,060 A * | 2/2000 | Lenz ....................... 118/723 R |
| 6,068,784 A | 5/2000 | Collins et al. ................ 216/68 |
| 6,261,408 B1 * | 7/2001 | Schneider et al. ....... 118/723 E |
| 6,354,241 B1 * | 3/2002 | Tanaka et al. ........... 118/723 E |
| 6,433,484 B1 * | 8/2002 | Hao et al. ............... 315/111.21 |

FOREIGN PATENT DOCUMENTS

| JP | 2000058512 | 2/2000 | ....... H01L/21/3065 |
| TW | 90124573 | 5/1997 | .......... H01L/21/00 |
| WO | 01/50498 A1 | 7/2001 | ........... H01J/37/32 |

OTHER PUBLICATIONS

International Search Report, Date of Mailing: Feb. 25, 2002.
International Search Report, Date of Mailing: May 24, 2002.

* cited by examiner

Primary Examiner—Wilson Lee
(74) Attorney, Agent, or Firm—Beyer Weaver & Thomas LLP (57) ABSTRACT

A plasma processing chamber is provided which provides improved wafer area pressure control. The plasma processing chamber is a vacuum chamber with a device connected for generating and sustaining a plasma. Part of this device would be an etchant gas source and an exhaust port. A confinement ring defines an area above a wafer. The wafer area pressure is dependent on the pressure drop across the confinement ring. The confinement ring is part of a wafer area pressure control device that provides wafer area pressure control range greater than 100%. Such a wafer area pressure control device may be three adjustable confinement rings and a confinement block on a holder that may be used to provide the desired wafer area pressure control.

17 Claims, 13 Drawing Sheets

WAFER AREA PRESSURE CONTROL FOR PLASMA CONFINEMENT

This is a Divisional application of prior Application No. 09/684,695 filed on Oct. 4,2000, now U.S. Pat. No. 6,492,774 the disclosure of which is incorporated herein by reference.

RELATED APPLICATIONS

This application is related to the commonly assigned U.S. patent application Ser. No. 09/637,736 entitled WAFER AREA PRESSURE CONTROL, by Fangli Hao, Eric Lenz, and Bruno Morel.

BACKGROUND OF THE INVENTION

The present invention relates to the processing equipment for the fabrication of semiconductor-based devices. More particularly, the present invention relates to improved techniques for confining and controlling the pressure of the plasma in plasma processing chambers.

In the fabrication of semiconductor-based devices (e.g., integrated circuits or flat panel displays) layers of material may alternately be deposited onto and etched from a substrate surface (e.g., the semiconductor wafer or glass panel). As is well known in the art, the etching of the deposited layer(s) may be accomplished by a variety of techniques including plasma-enhanced etching. In plasma-enhanced etching, the etching of the deposited layer(s) on the substrate takes place inside a plasma processing chamber. During etching, a plasma is formed from a suitable etchant gas source to etch areas of the deposited layer(s) on the substrate that are unprotected by the mask, leaving behind the desired pattern.

Among different types of plasma etching systems, those utilizing methods to confine the plasma to a volume immediately above the substrate have proven highly suitable for efficient production and/or for forming the ever-shrinking features on the substrate. An example of such a system may be found in commonly assigned U.S. Pat. No. 5,534,751, which is incorporated by reference herein. Although plasma confinement results in a significant improvement in the performance of plasma processing systems, current implementations can be improved. In particular, it is realized that improvements can be made in the control of the pressure of the confined plasma and the accessibility of the plasma processing volume for substrate transport.

Figure 1A:
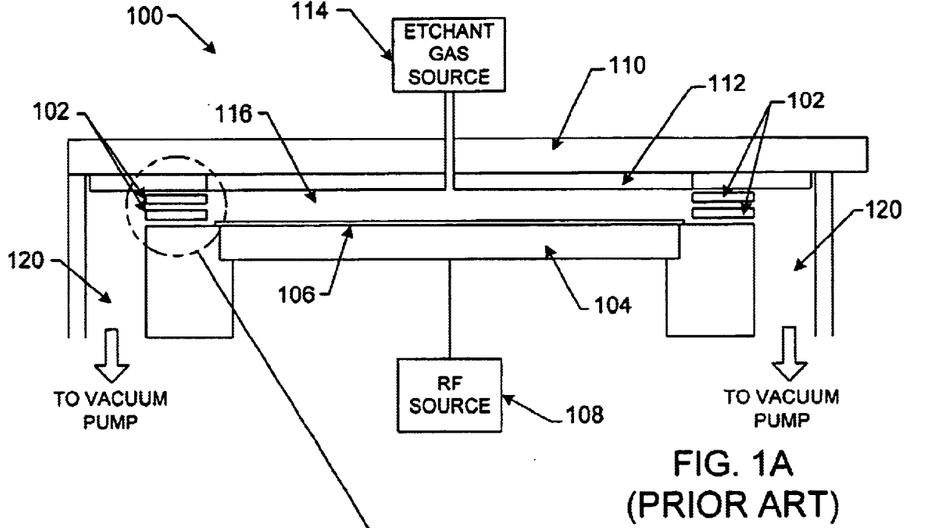
FIGS. 1A–C are schematic views of a prior art plasma processing chamber.

To facilitate discussion, FIG. 1A depicts an exemplary plasma processing chamber 100, including confinement rings 102 as they are currently implemented. Within plasma processing chamber 100, the substrate 106 is positioned upon the lower electrode 104. The lower electrode 104 incorporates a suitable substrate chucking mechanism (e.g., electrostatic, mechanical clamping, or the like) for holding the substrate 106. The reactor top 110 incorporates an upper electrode 112 disposed immediately opposite the lower electrode 104. The upper electrode 112, lower electrode 104, and confinement rings 102 define the confined plasma volume 116. Gas is supplied to the confined plasma volume 116 by etchant gas source 114 and is exhausted from the confined plasma volume 116 through the confinement rings 102 and exhaust port 120 by a vacuum pump. With gas flowing and an appropriate pressure established within the confined plasma volume, a plasma is formed within this volume by application of RF power to the lower electrode by RF source 108 while grounding upper electrode 112. Alternately, as is well known in the art, the plasma may be formed by applying RF power to both lower electrode 104 and upper electrode 112, or by grounding lower electrode 104 and applying RF power to upper electrode 112.

The confinement rings 102 serve both to confine the plasma to the volume 106 and to control the pressure of the plasma. The confinement of the plasma to the volume 116 is a function of many factors including the spacing between the confinement rings 102, the pressure in the volume outside the confinement rings and in the plasma, the type and flow rate of the gas, as well as the level and frequency of RF power. For effective plasma confinement, the pressure outside the confinement rings 102 should be as low as possible, preferably less than 30 millitorr. Confinement of the plasma is more easily accomplished if the spacing between the confinement rings 102 is very small. Typically, a spacing of 0.15 inches or less is required for confinement. However, the spacing of the confinement rings also determines the pressure of the plasma, and it is desirable that the spacing can be adjusted to achieve the pressure required for optimal process performance while maintaining plasma.

Figure 1B:
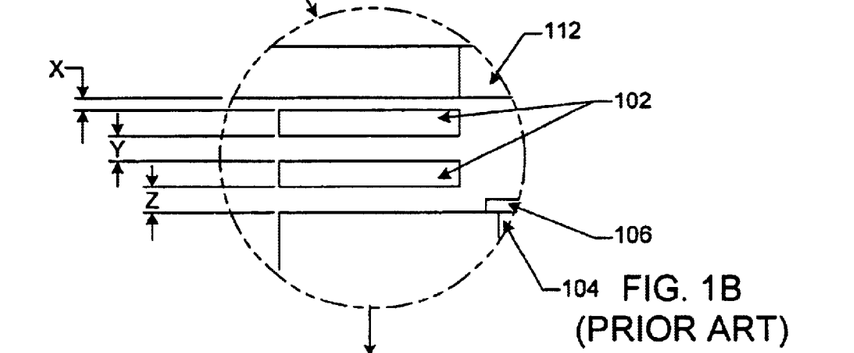
Figure 2:
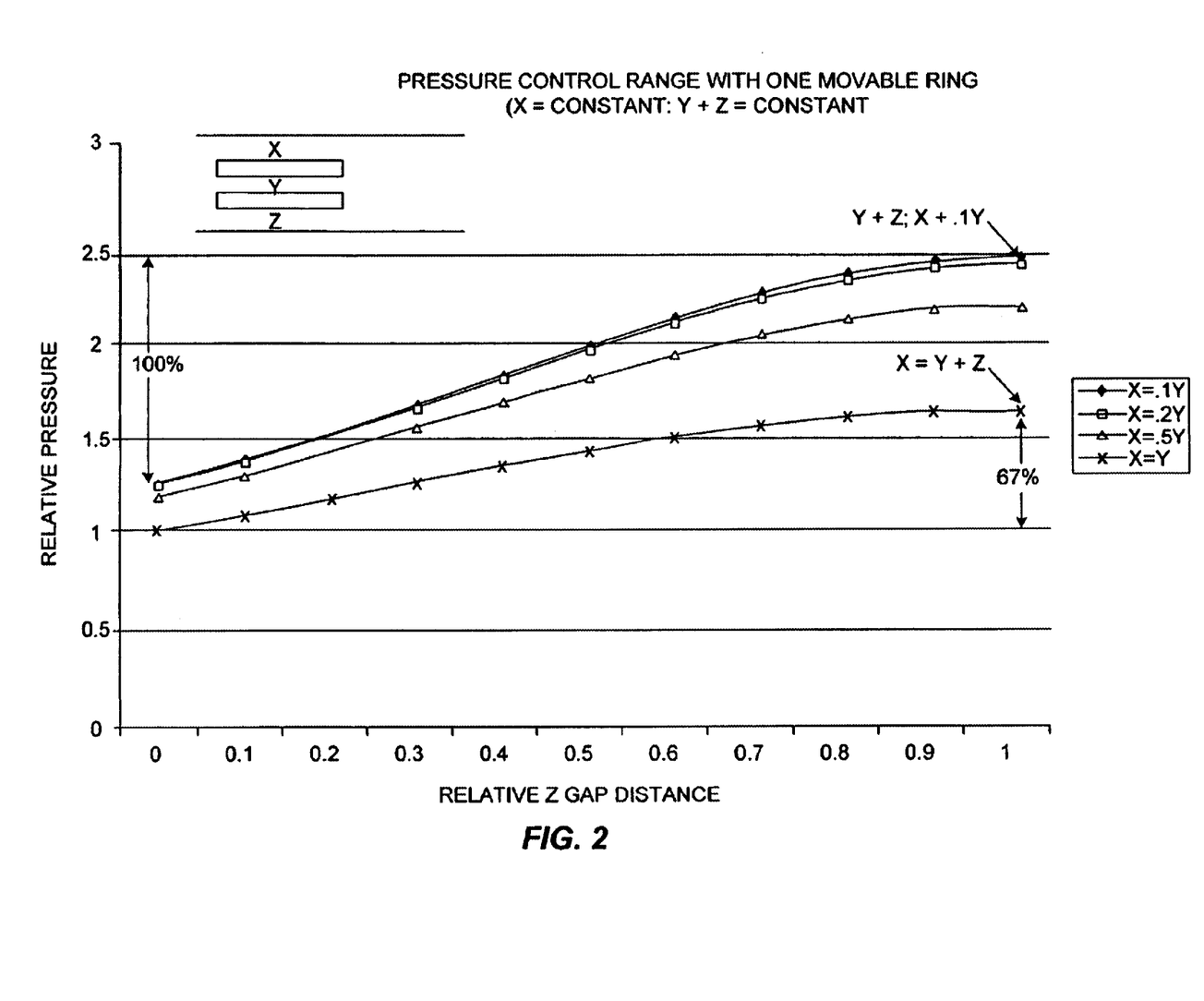
FIG. 2 is a graph illustrating the relative pressure achieved with the prior art.

Commonly assigned U.S. Pat. No. 6,019,060 entitled "Cam-Based Arrangement for Positioning Confinement Rings In A Plasma Processing Chamber" by Eric H. Lenz, issued Feb. 1, 2000, incorporated by reference, taught that the pressure drop across the confinement rings is approximately proportional to the expression $1/(X^2+Y^2+Z^2)$ where X, Y and Z are the distances between confinement rings as shown in FIG. 1B. Lenz provided a single movable ring and a stationary ring (X=constant, Y+Z=constant in FIG. 1B). By adjusting the distances Y and Z by moving the single movable confinement ring, as taught by Lenz, a plasma pressure control range can be obtained. FIG. 2 illustrates the relative pressure predicted by the expression above obtained by moving a single ring for of various fixed gaps, X. The expression predicts a. control range of 67–100% can be obtained, as illustrated in FIG. 2, while experiments found the achievable range to be approximately one half those values. In many cases, a wider plasma pressure range is required to achieve optimal process results on various types of films and devices within the same processing system.

Figure 1C:
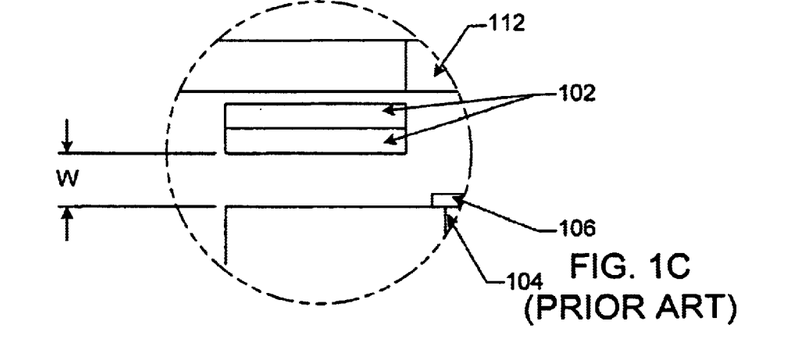

In addition, in the method taught by Lenz, the confinement rings 102 are constrained between the upper and lower electrode assemblies and thus can restrict access to the interelectrode space for loading and unloading of substrates. As shown in FIG. 1C, even with the confinement rings 102 lifted to their uppermost position, the access to the interelectrode space is limited to the gap W, which is the difference of the total interelectrode space less the combined thicknesses of the confinement rings.

It is desirable to provide an increased range of pressure control while maintaining plasma confinement. It is also desirable to provide confinement rings that greater facilitate placement and removal of the substrate from the plasma processing system.

SUMMARY OF THE INVENTION

To achieve the foregoing and other objects and in accordance with the purpose of the present invention, a plasma processing device is provided. A vacuum chamber with an exhaust port and vacuum pump in fluid connection with the vacuum chamber and a gas source in fluid connection with the vacuum chamber is provided. Within the vacuum chamber a wafer area pressure control device for providing wafer area pressure control range greater than 500% is placed.

In addition, the present invention provides a method of controlling wafer area pressure. Generally, a substrate is placed in a vacuum chamber. A gas source is provided to the vacuum chamber. Gas is also exhausted from the vacuum chamber. At least one ring is moved to provide wafer area pressure control range greater than 500%.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 3:
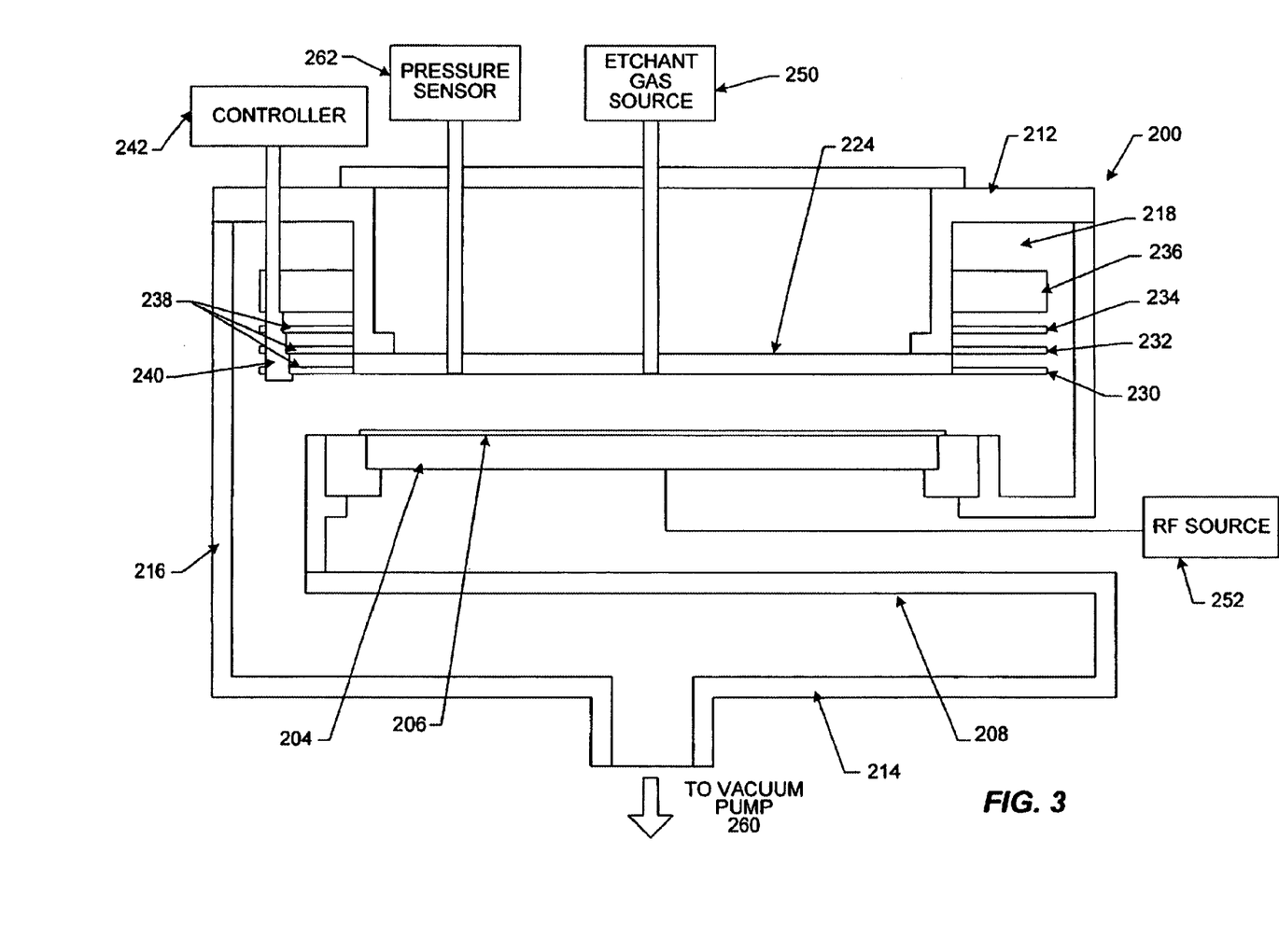
FIG. 3 is a schematic view of a plasma processing chamber according to one embodiment of the invention.

To facilitate discussion, FIG. 3 is a cross-sectional view of a plasma processing chamber 200. The chamber has a top 212 and a bottom 214, and a chamber wall 216 extending from the top 212 to the bottom 214. Cantilevered from one side of the chamber is a lower electrode housing 218 in which is fixtured a chuck 204, which is a workpiece holder on which a substrate 206 is positioned during etching. The chuck 204 may be implemented by any suitable chucking technique, e.g., electrostatic, mechanical clamping, vacuum, or the like. An RF power supply 252 may be electrically connected to the chuck 204. The reactor top 212 supports an upper electrode 224 and may be electrically connected to an RF power supply. A confinement mechanism comprising a first adjustable confinement ring 230, a second adjustable confinement ring 232, a third adjustable confinement ring 234, and a confinement block 236 are disposed within the processing chamber 200. A holder 240 may be used to support the first adjustable confinement ring 230, second adjustable confinement ring 232, third adjustable confinement ring 234, and confinement block 236. A controller 242 connected to the holder 240 controls the movement of the holder 240 and therefore the first adjustable confinement ring 230, second adjustable confinement ring 232, third adjustable confinement ring 234, and confinement block 236. In the preferred embodiment of the invention, the holder 240 is stepped with a confinement ring or block resting on each step. The steps provide a maximum gap spacing between the confinement rings and block, which in the preferred embodiment of the invention is between 0.09 to 0.15 inches (2.28 to 3.81 mm). The first adjustable confinement ring 230, the second adjustable confinement ring 232 and the third adjustable confinement ring 234 each are fixtured with spacers 238, which fix the minimum gap between each confinement ring and block. In this embodiment the spacer is of a size to provide a minimum gap between 0.005 and 0.060 inches (0.13 to 1.52 mm). An etchant gas source 250 provides gas to the chamber. A pressure sensor 262 measures the pressure in the volume above the substrate 206, the "Wafer Area Pressure", or "WAP". The chamber 200 has an exhaust port 260.

Figure 5:
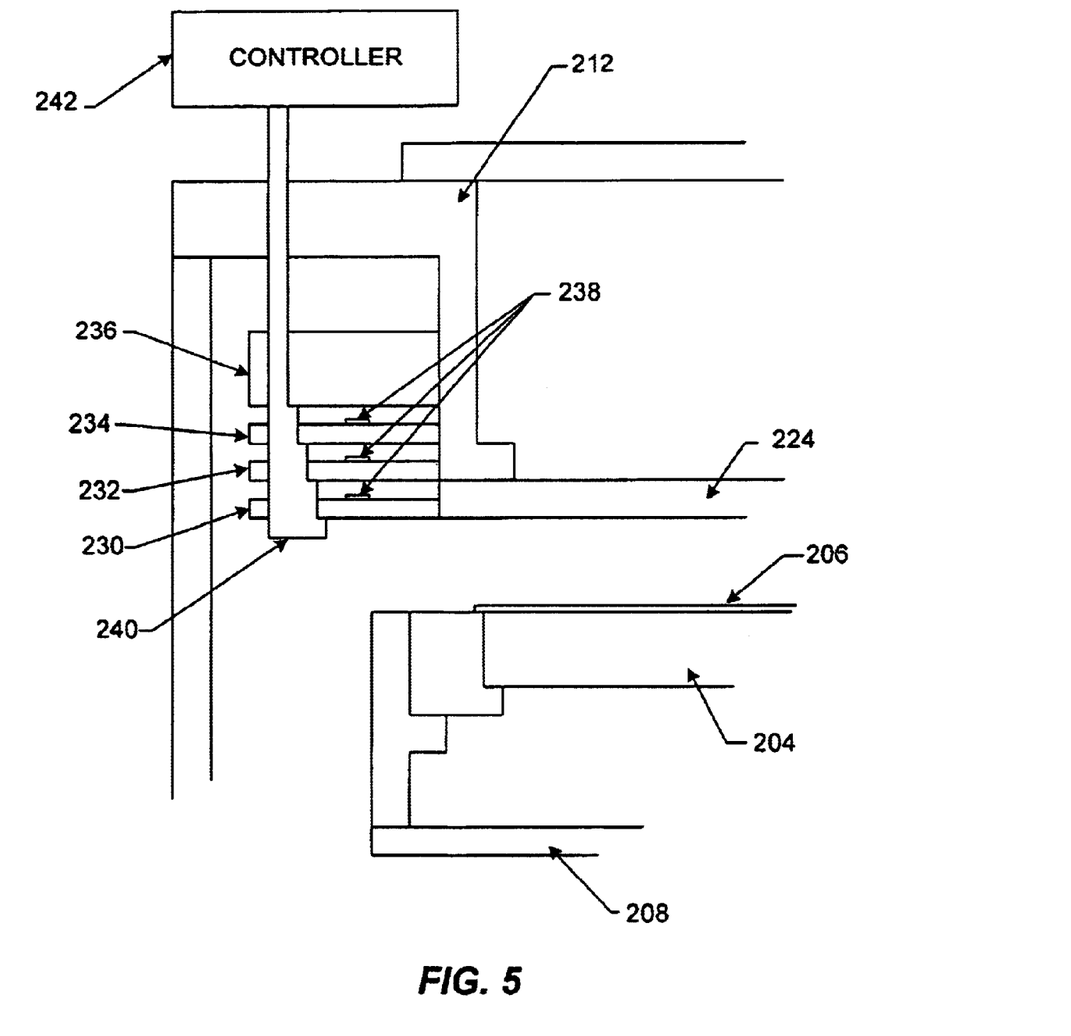
FIG. 5 is a schematic view of a section of the plasma processing chamber shown in FIG. 3 where the confinement rings are in their uppermost position.

In operation of this embodiment, the controller 242 raises the holder 240 to its highest position as shown in FIG. 3 and in detail in FIG. 5. Such a position lifts the first adjustable confinement ring 230, second adjustable confinement ring 232, third adjustable confinement ring 234, and confinement block 236 to a height such that the gap between the underside of the first containment ring 230 and the plane of the chuck 204 is, at a minimum, of size sufficient to allow the robotic placement of the substrate 206 onto the chuck 206. In the preferred embodiment, this gap is on the order of 0.5 inches (12 mm).

Figure 4:
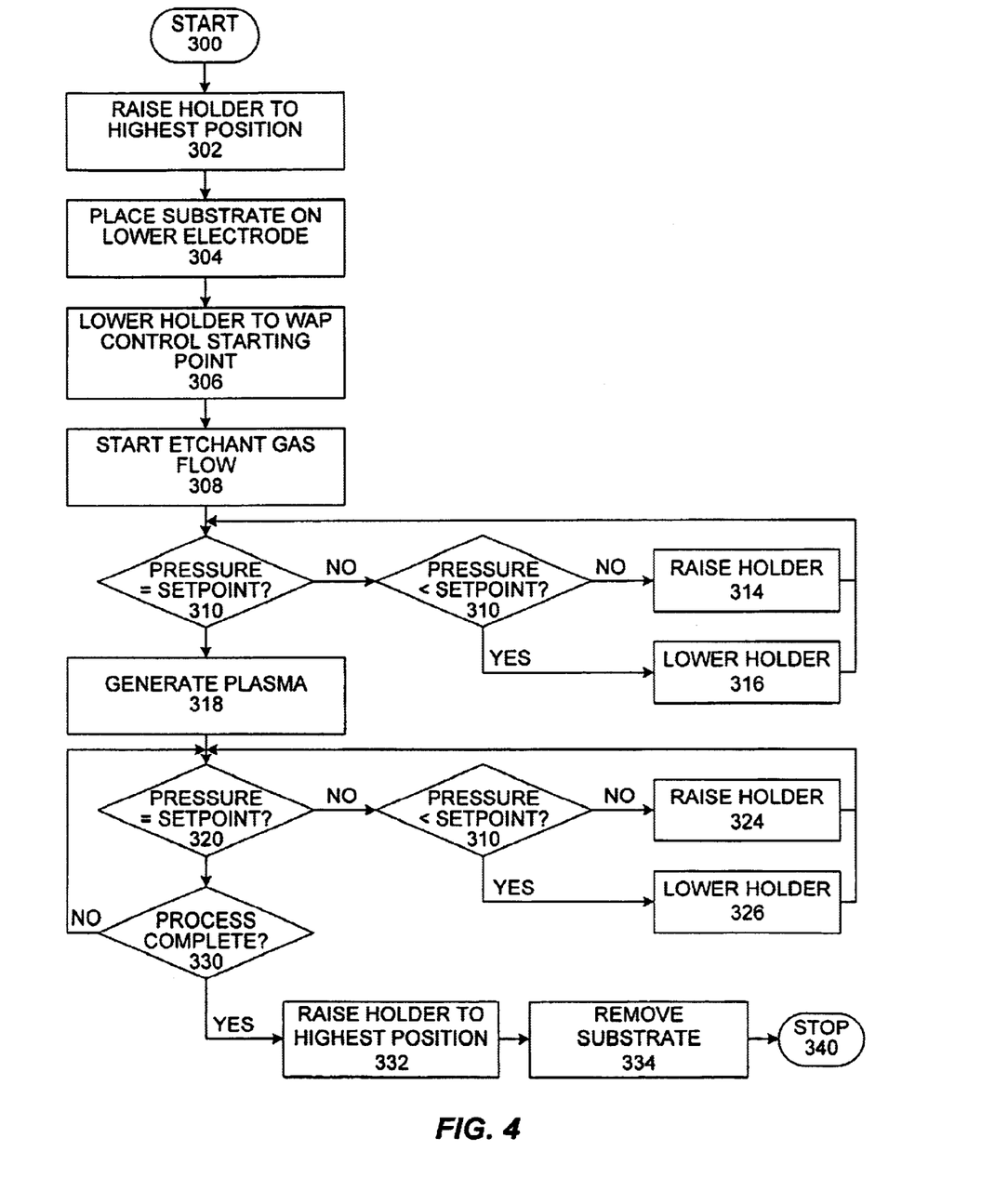
FIG. 4 is a flow chart of the operation of the preferred embodiment of the invention.
Figure 6:
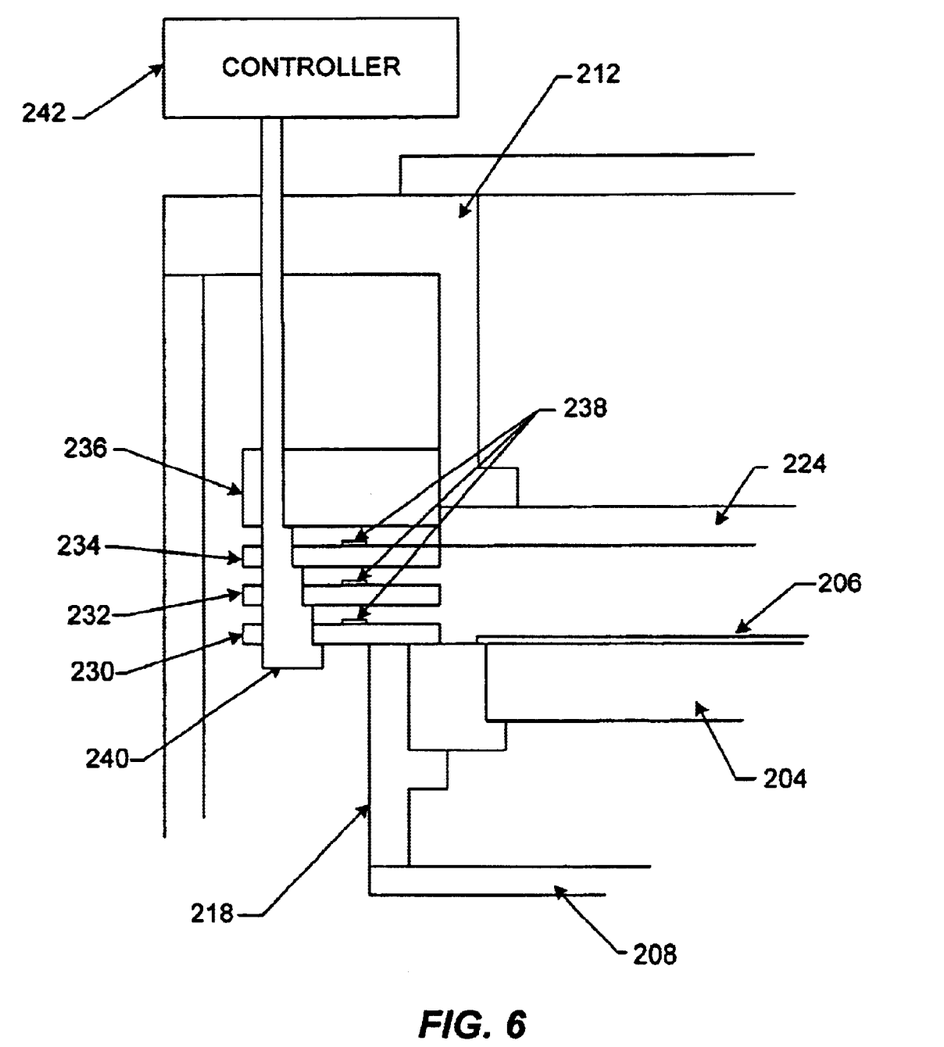
FIG. 6 is schematic view of the plasma processing chamber shown in FIG. 5, where the confinement rings have been lowered.
Figure 7:
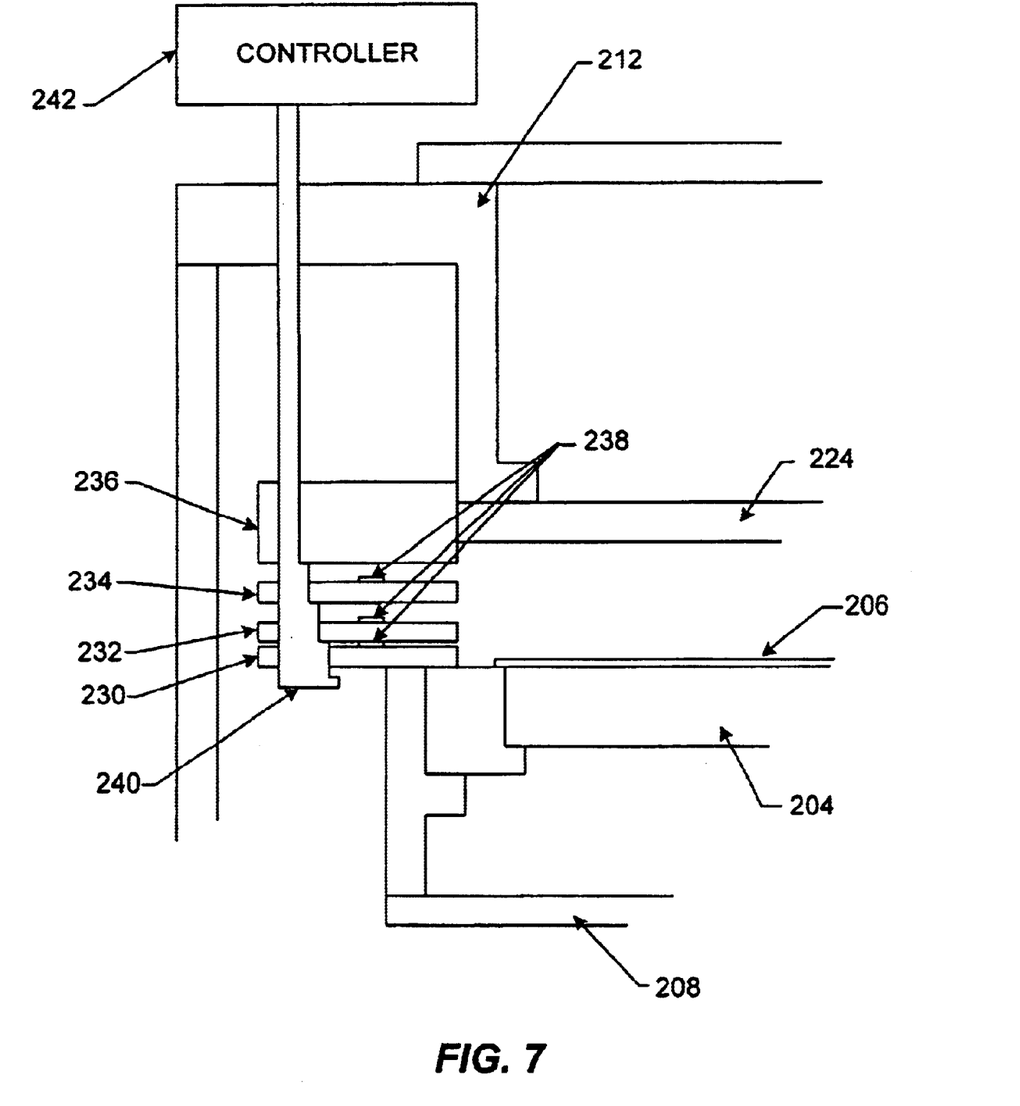
FIG. 7 is schematic view of the plasma processing chamber shown in FIG. 6, where the confinement rings have been lowered further so as to reduce the lowermost gap to its minimum
Figure 8:
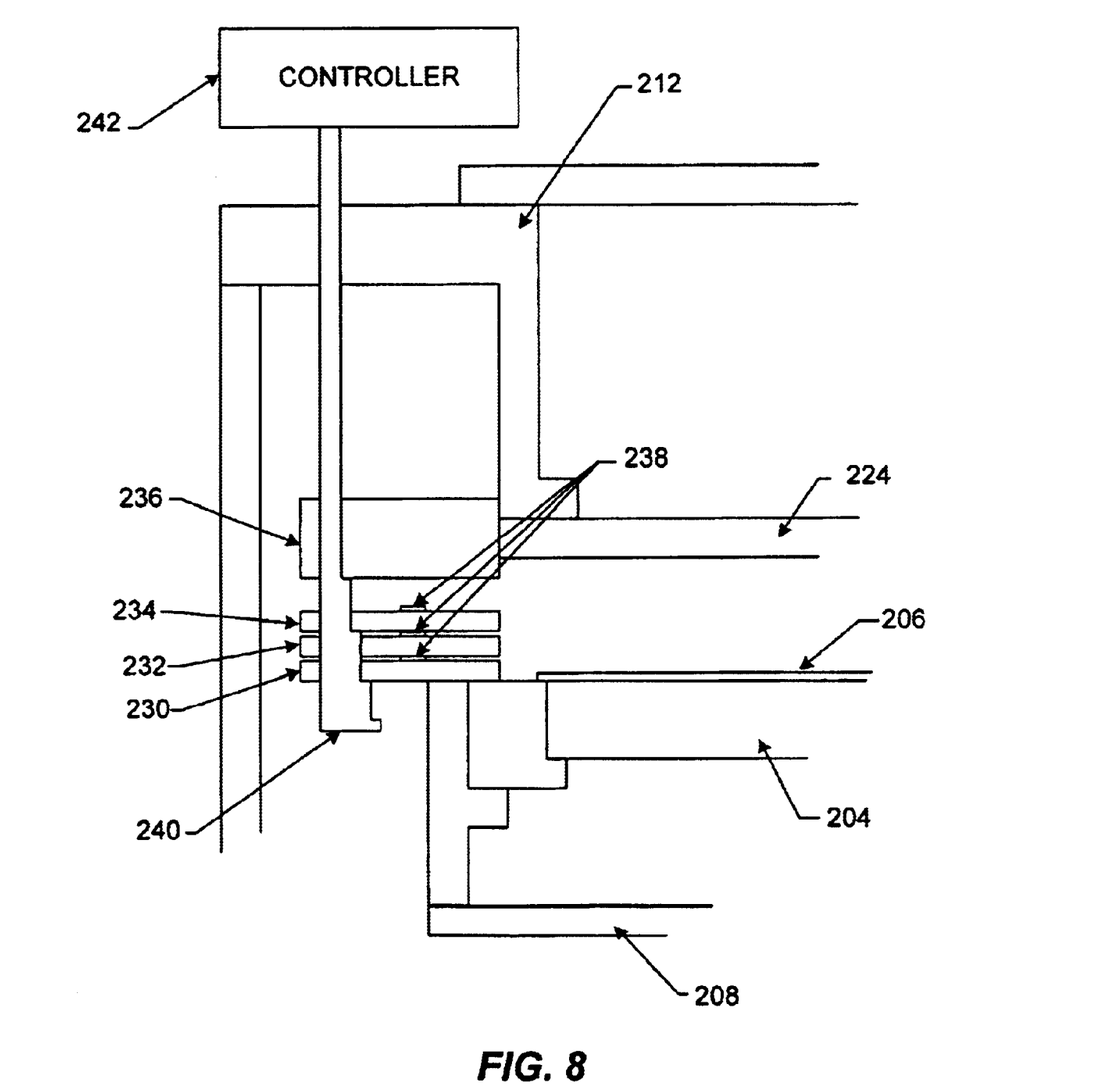
FIG. 8 is schematic view of the plasma processing chamber shown in FIG. 7, where the confinement rings have been lowered further so as to reduce the middle gap to its minimum.
Figure 9:
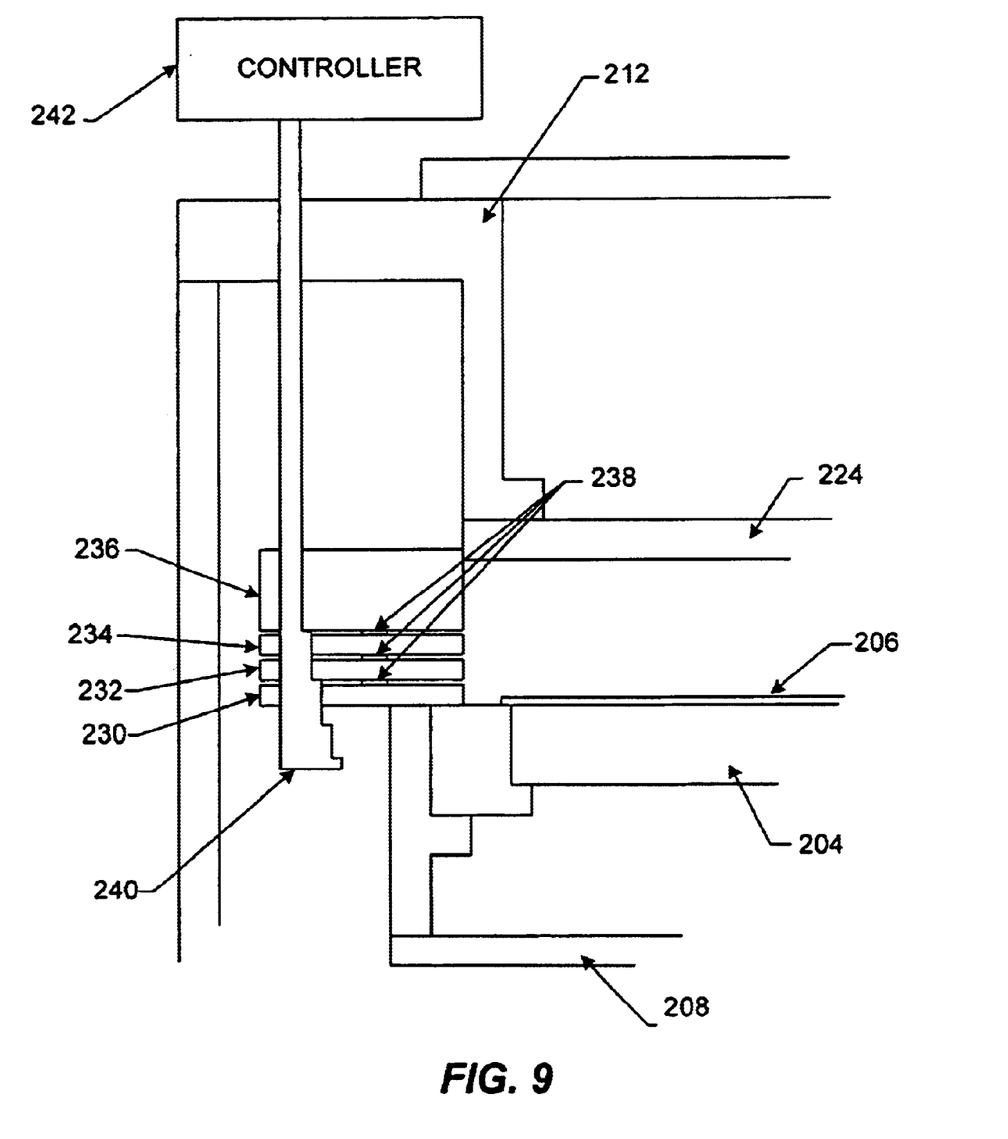
FIG. 9 is schematic view of the plasma processing chamber shown in FIG. 8, where the confinement rings have been lowered further so as to reduce the uppermost gap to its minimum.

FIG. 4 is a flow chart of the operation of the preferred embodiment of the invention. In operation, the holder raises the first adjustable confinement ring 230, second adjustable confinement ring 232, third adjustable confinement ring 234, and confinement block 236 to the position shown in FIG. 5 (step 302). A robotic mechanism may be used to place the substrate 206 on the chuck 204 (step 304). The controller 242 lowers the holder 240 to a wafer area pressure control starting point (step 306). The wafer area pressure control starting point may be the position of the first adjustable confinement ring 230, second adjustable confinement ring 232, third adjustable confinement ring 234, and confinement block 236 that allows minimal pressure drop while maintaining sufficient confinement during processing. In this embodiment the wafer area pressure control starting point may be when the first adjustable confinement ring 230 begins resting on the lower electrode housing 218, as shown in FIG. 6. Etchant gas flow is then initiated (step 308) and the pressure within the wafer area as measured by the pressure sensor 252 is compared to a desired setpoint value (steps 310). If the wafer area pressure needs to be increased (step 312), the controller 242 may further lower the holder 240 (step 316). FIG. 7 illustrates a chamber 200 where the holder 240 is lowered to a point where the second confinement ring 232 rests on the spacers 238 of the first confinement ring 230. FIG. 8 illustrates a chamber 200 where the holder 240 is lowered further to a point where the third confinement ring 234 rests on the spacers 238 of the second confinement ring 232. FIG. 9 illustrates a chamber 200 where the holder 240 is lowered further still to a point where the confinement block 236 rests on the spacers 238 of the third confinement ring 234. This is the lowest wafer area control position, and the holder 240 is not lowered any further.

If the wafer area pressure needs to be decreased, the controller 242 may raise the holder 240 (step 314). Once the holder 240 reaches the highest wafer area pressure control position, as shown in FIG. 6, the holder 240 is not raised any further during the wafer area pressure control stage. Once the wafer area pressure is equal to the desired setpoint value, the plasma is initiated (step 318). The wafer area pressure is again compared against a setpoint (step 320) and the position of the confinement rings adjusted by raising or lowering the holder 240 (steps 322, 324, 326) to achieve and maintain the desired pressure until the plasma process is deemed complete (step 330), whereupon the holder 240 is raised to its highest position (step 332), and the robitic mechanism is used to remove the substrate (step 334), so that the process may be repeated.

In the preferred embodiment the change in the pressure drop across the confinement rings as the holder 240 is lowered from its highest control position, as shown in FIG. 6, to its lowest control position, as shown in FIG. 9, may change by 300–800%. Control of the pressure drop is provided in that to increase wafer area pressure the holder is moved downward and to decrease pressure the holder is moved upward. As shown in FIG. 9, the confinement block 236 is of sufficient thickness such that that the top of the confinement block 236 is above the lowest part of the upper electrode 224 so as to prevent exiting the wafer area by flowing over the top of the confinement block 236.

In an example of the dimensions that may be used in this embodiment, the gap between the confinement block 236 and the upper electrode 224, which is surrounded by the confinement block 236, may be between 0.0125 and 0.0500 inches (0.32 to 1.27 mm). More preferably, the gap is about 0.025 inches (0.63 mm). The thickness of the first, second, and third adjustable confinement rings 230, 232, 234 are between 0.045 to 0.180 inches (1.14 to 4.57 mm). More preferably the thickness is about 0.09 inches (2.29 mm). The distance between the upper electrode 224 and the lower electrode 204 may be in the range of 0.4 to 3.0 inches (10 mm to 76.2 mm). More preferable the distance is about 0.6 inches (15 mm).

Figure 10:
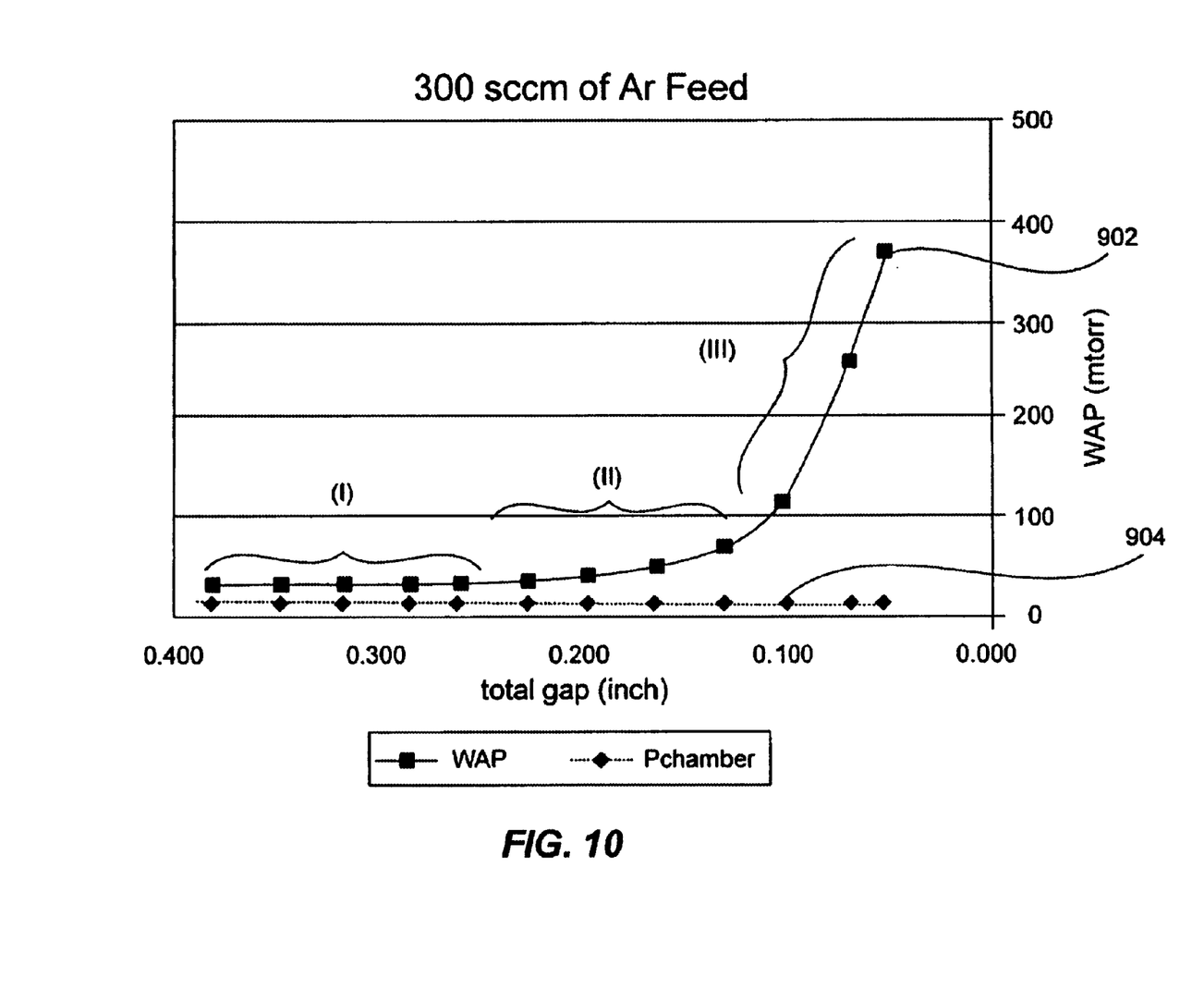
FIG. 10 is a graph of pressure with respect to the sum of the gap sizes.

FIG. 10 is a graph of wafer area pressure with respect to the sum of the gap distances in inches between the first adjustable confinement ring 230 and second adjustable confinement ring 232; the second adjustable confinement ring 232 and third adjustable confinement ring 234; and the third adjustable confinement ring 234 and confinement block 236. In this example, the pressure is measured with a flow of 300 standard cubic centimeters per minute (sccm) of Argon being fed into the chamber 200. The square data points 902 represent wafer area pressure, which is pressure within the confinement rings. The diamond data points 904 represent the pressure of the chamber 200. Section (I) corresponds to the movement of the confinement rings from the position shown in FIG. 6 to the position shown in FIG. 7. Section (II) corresponds to movement of the confinement rings from the position shown in FIG. 7 to the position shown in FIG. 8. Section (III) corresponds to the movement of the confinement rings from the position shown in FIG. 8 to the position shown in FIG. 9.

Figure 11:
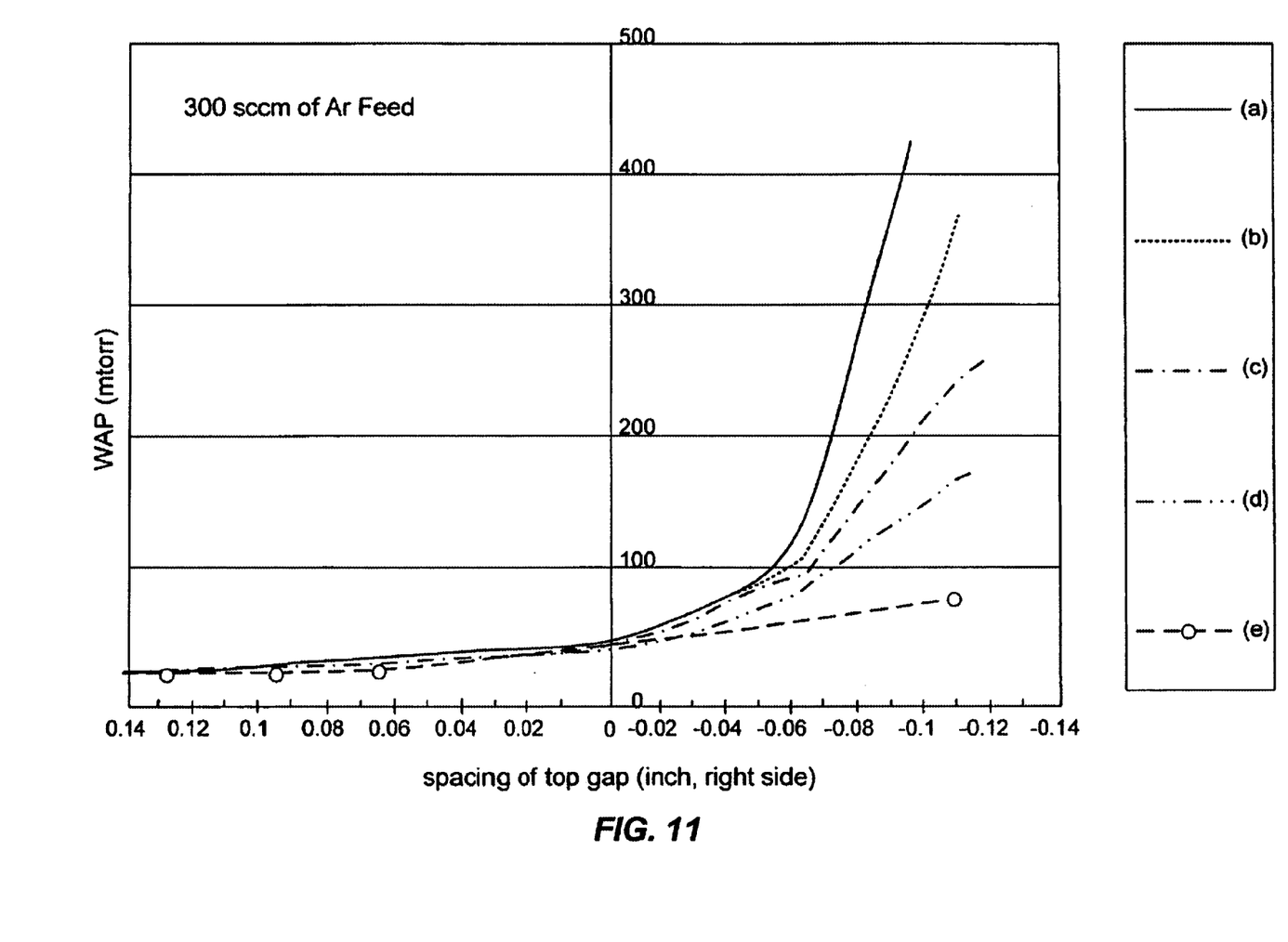
FIG. 11 is a graph of pressure with respect to the sum of the gap sizes for various values of minimum gap size

FIG. 11 is a graph of the wafer area pressure with respect to the sum of the gap distances in inches corresponding to Sections (II) and (III) in FIG. 10, but for differing values of minimum gap distances as set by the spacers 236. In Curve (a), the minimum gap distance as set by the spacers 236 is 0.007 inches for the gap between the first (230) and second (232) adjustable confinement rings and 0.007 inches for the gap between the second (232) and third (234) adjustable confinement rings. In Curve (b) the minimum gap distance as set by the spacers 236 is 0.030 inches for the gap between the first 230 and second 232 adjustable confinement rings and 0.007 inches for the gap between the second 232 and third 234 adjustable confinement rings. In Curve (c) the minimum gap distance as set by the spacers 236 is 0.038 inches for the gap between the first 230 and second 232 adjustable confinement rings and 0.030 inches for the gap between the second 232 and third 234 adjustable confinement rings. In Curve (d) the minimum gap distance as set by the spacers 236 is 0.038 inches for the gap between the first 230 and second 232 adjustable confinement rings and 0.038 inches for the gap between the second 232 and third 234 adjustable confinement rings. In Curve (e) the minimum gap distance as set by the spacers 236 is 0.062 inches for the gap between the first 230 and second 232 adjustable confinement rings and 0.062 inches for the gap between the second 232 and third 234 adjustable confinement rings. From the graph in FIG. 11 it can be seen that the pressure control range and the slope of the pressure control can be changed by the use of different spacers 236 to change the minimum gap distance.

The holder may be any device that allows one or more controllers to provide an upward and downward movement of the confinement rings and confinement blocks, where in a raised position the holder maintains a maximum gap between the confinement rings and the confinement block and in a lowered position the holder allows the confinement rings and confinement block to form minimum gaps. Preferably, the holder allows one gap at a time to decrease until the gap is minimized. Once a gap is minimized, another gap is decreased. The holder 240 in FIG. 5 is a type of hanger, since the holder 240 is below the controller 242. In another embodiment, the holder 240 could be configured so as to be above the controller 242, and the holder 240 is now a type of platform.

Although three confinement rings and a confinement block are shown in the preferred embodiment, other numbers of confinement rings and blocks may be used. In the preferred embodiment, the number and spacing of the confinement rings and confinement block are such that at the highest position, at least part of the lowest confinement ring is above the lowest part of the upper electrode and, for a wafer area pressure control initial position, the lowest confinement ring rests on a surface coplanar with the lower electrode and the confinement rings and a portion of the confinement block are below the upper electrode. This embodiment helps to avoid stagnation points, which may cause the accumulation of deposited polymer films.

Figure 12:
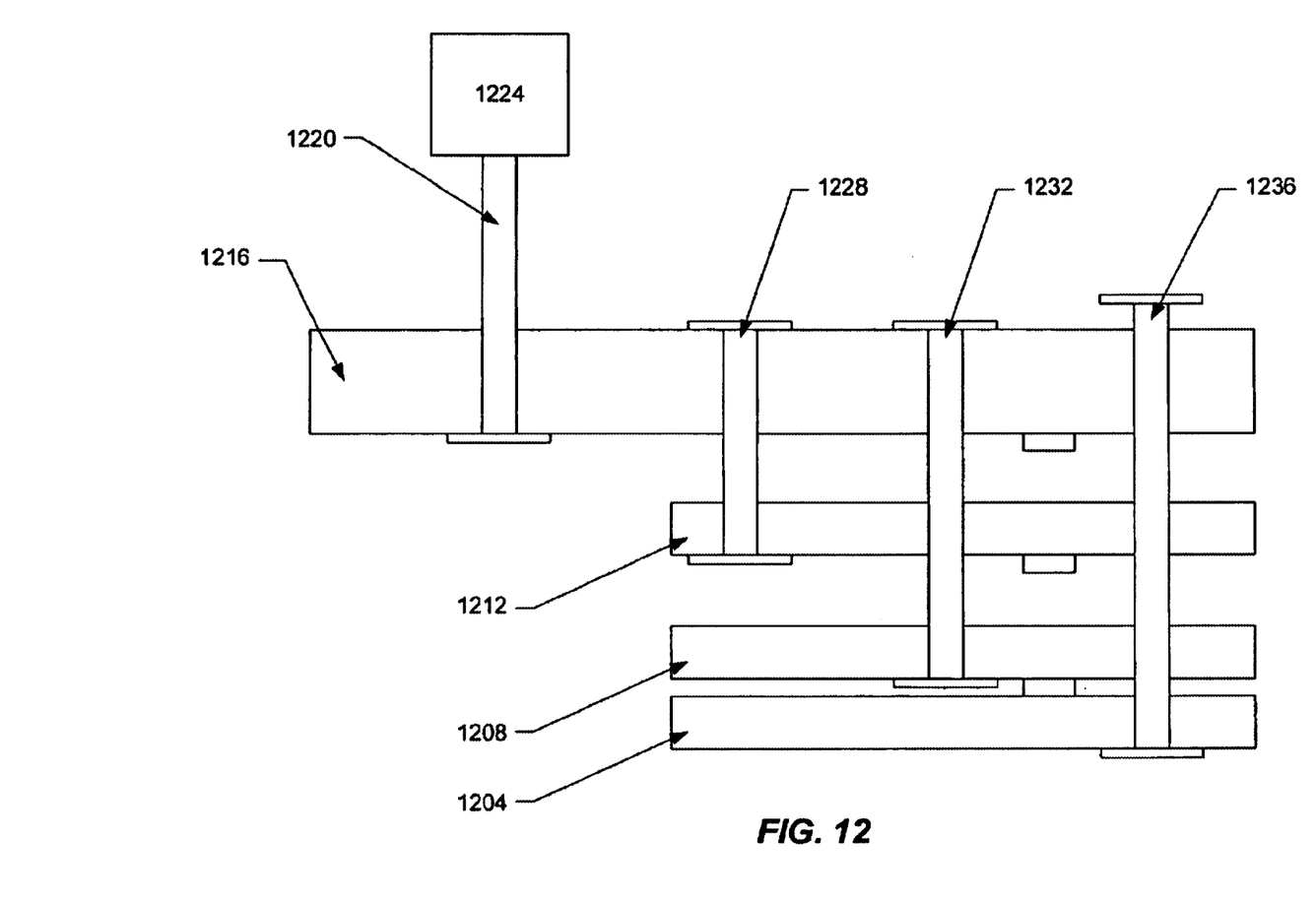
FIG. 12 is a schematic view of a plasma processing chamber of another embodiment of the invention.

In another embodiment, the holder may comprise a plurality of hangers with each hanger suspending a different confinement ring. FIG. 12 illustrates parts of a first adjustable confinement ring 1204, a second adjustable confinement ring 1208, a third adjustable confinement ring 1212, and a confinement block 1216. A first hanger 1220 is suspended from a controller 1224. The confinement block 1216 hangs from the first hanger 1224. A second hanger 1228, a third hanger 1232, and a fourth hanger 1236 hang from the confinement block 1216. The second hanger 1228 supports the third adjustable confinement ring 1212. The third hanger 1232 supports the second adjustable confinement ring 1208. The fourth hanger 1236 supports the first adjustable confinement ring 1204. The second, third, and fourth hangers allow the first, second, and third adjustable confinement rings to stop moving when they reach their lowest point, as described in the previous embodiment.

Figure 13:
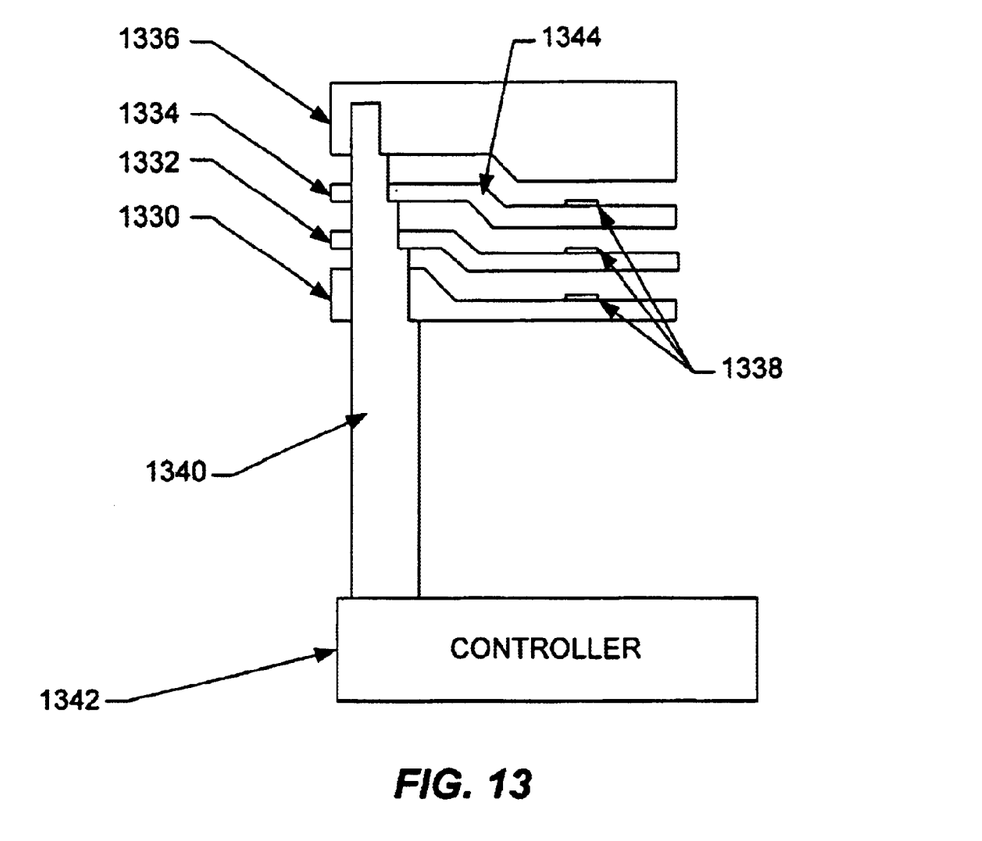
FIG. 13 is a schematic view of part of another embodiment of the invention.

In yet another embodiment, the profile of the confinement ring may be complex. FIG. 13 illustrates parts of a first adjustable confinement ring 1330, a second adjustable confinement ring 1332, a third adjustable confinement ring 1334, and a confinement block 1336. A holder 1340 may be used to support the first adjustable confinement ring 1330, second adjustable confinement ring 1332, third adjustable confinement ring 1334, and confinement block 1336. A controller 1342 connected to the holder 1340 controls the movement of the holder 1340 and therefore the first adjustable confinement ring 1330, second adjustable confinement ring 1332, third adjustable confinement ring 1334, and confinement block 1336. The holder 1340 is stepped with a confinement ring or block resting on each step. The steps define the maximum gap spacing between the confinement rings and block. The first adjustable confinement ring 1330, second adjustable confinement ring 1332, and third adjustable confinement ring are fixtured with spacers 1338, which define the minimum gap spacing between adjacent confinement rings. The mating surfaces of the confinement rings 1330, 1332, 1334 and the confinement block 1336 are not flat, but instead incorporate a "profile" such that, at the maximum gap spacing, the gaps are "optically dense", that is they do not provide a direct line of sight, which may serve to improve confinement of the plasma by minimizing the streaming of charged particles from the plasma, through the gaps into the volume outside the confinement rings. FIG. 13 illustrates one embodiment of this "profile", consisting of a vertical offset 1344 in each mating surface of a magnitude greater than one half the maximum gap spacing. The offset in each mating surface is radially staggered to allow each mating surface to be brought into close proximity with the next.

While this invention has been described in terms of several preferred embodiments, there are alterations, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. An adjustable confinement ring assembly, for use in a wafer area pressure control device, which comprises confinement block and a controller for raising and lowering the adjustable confinement ring assembly and the confinement block, wherein the wafer area pressure control device is used in a vacuum chamber with an exhaust port and a gas source in fluid connection with the vacuum chamber, the adjustable confinement ring assembly, comprising:

a first confinement ring; and a first spacer attached to the first confinement ring for providing a spacing between the first confinement ring and the confinement block and wherein the spacer is not attached to the confinement block.

2. An adjustable confinement ring assembly, for use in a wafer area pressure control device, which comprises confinement block and a controller for raising and lowering the adjustable confinement ring assembly and the confinement block, wherein the wafer area pressure control device is used in a vacuum chamber with an exhaust port and a gas source in fluid connection with the vacuum chamber, the adjustable confinement ring assembly, comprising:

a first confinement ring;

a first spacer attached to the first confinement ring; and a second confinement ring, wherein the first spacer provides a spacing between the first confinement ring and the second confinement ring and wherein the spacer is not attached to the second confinement ring.

3. The adjustable confinement ring assembly, as recited in claim 2, wherein the first spacer provides a minimum spacing between 0.005 and 0.060 inches between the first confinement ring and the second confinement ring.

4. The adjustable confinement ring assembly, as recited in claim 3, wherein the first confinement ring has a thickness between 0.045 and 0.180 inches.

5. The adjustable confinement ring assembly, as recited in claim 4, wherein the second confinement ring has a thickness between 0.04 5 and 0.180 inches.

6. The adjustment ring assembly, as recited in claim 5, wherein the vacuum chamber further comprises an upper electrode, and wherein the confinement ring has an inner diameter larger than an outer diameter of the upper electrode, to allow the confinement ring to be moved to a vertical height to surround the upper electrode.

7. The adjustment ring assembly, as recited in claim 6, wherein the confinement ring forms a gap of between 0.0125 and 0.0500 inches between the inner diameter of the confinement ring and the outer diameter of the upper electrode.

8. The adjustable confinement ring assembly, as recited in claim 7, further comprising a second spacer for providing a spacing between the second confinement ring and the confinement block.

9. The adjustable confinement ring assembly, as recited in claim 2, further comprising a second spacer for providing a spacing between the second confinement ring and the confinement block.

10. The adjustable confinement ring assembly, as recited in claim 2, further comprising:

a third confinement ring; and a second spacer which provides a spacing between the second confinement ring and the third confinement ring, wherein the second spacer is attached to the second confinement ring, but not to the third confinement ring.

11. The adjustable confinement ring assembly, as recited in claim 10, wherein the controller comprises a hanger, and wherein first, second, and third confinement rings are adapted to receive the hanger, wherein the hanger is able to move the first, second, and third confinement rings from a maximum spacing to a minimum spacing.

12. The adjustable confinement ring assembly, as recited in claim 1, wherein the first spacer extends from a surface of the first confinement ring.

13. An adjustable confinement ring assembly, for use in a wafer area pressure control device, which comprises confinement block and a hanger for raising and lowering the adjustable confinement ring assembly and the confinement block, wherein the wafer area pressure control device is used in a vacuum chamber with an exhaust port and a gas source in fluid connection with the vacuum chamber, the adjustable confinement ring assembly, comprising:

a first confinement ring adapted to receive the hanger;

a second confinement ring adapted to receive the hanger, wherein the hanger changes the spacing between the first confinement ring and the second confinement ring; and a first spacer attached to the first confinement ring and disposed between the first and second confinement rings, wherein the spacer is not attached to the second confinement ring, and wherein the spacer provides a minimum spacing of between 0.005 and 0.060 inches between the first confinement ring and the second confinement ring, wherein the spacer is spaced apart from the hanger.

14. The adjustable confinement ring assembly, as recited in claim 13, wherein the first spacer is extends from a surface of the first confinement ring.

15. The adjustable confinement ring assembly, as recited in claim 2, wherein the first spacer is spaced apart from the controller for raising and lowering the adjustable confinement ring assembly.

16. The adjustable confinement ring assembly, as recited in claim 2, wherein the first spacer provides a minimum spacing of about 0.025 inches.

17. The adjustable confinement ring assembly, as recited in claim 13, wherein the first spacer provides a minimum spacing of about 0.025 inches.

* * * * *